United States Patent
Inoue et al.

(10) Patent No.: US 9,165,764 B2
(45) Date of Patent: Oct. 20, 2015

(54) PLASMA TREATMENT METHOD AND PLASMA TREATMENT DEVICE

(71) Applicant: TOKYO ELECTRON LIMITED, Tokyo (JP)

(72) Inventors: Masaki Inoue, Albany, NY (US); Kazuhisa Ishii, Miyagi (JP); Motoki Noro, Hsin-chu (TW); Shinji Kawada, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/371,625

(22) PCT Filed: Dec. 7, 2012

(86) PCT No.: PCT/JP2012/081838
§ 371 (c)(1),
(2) Date: Jul. 10, 2014

(87) PCT Pub. No.: WO2013/111461
PCT Pub. Date: Aug. 1, 2013

(65) Prior Publication Data
US 2014/0329390 A1 Nov. 6, 2014

(30) Foreign Application Priority Data

Jan. 26, 2012 (JP) .................................. 2012-014471

(51) Int. Cl.
*H01L 21/302* (2006.01)
*H01L 21/02* (2006.01)
*H01L 21/311* (2006.01)
*H01J 37/32* (2006.01)
*H01L 29/66* (2006.01)

(52) U.S. Cl.
CPC ....... *H01L 21/0234* (2013.01); *H01J 37/32192* (2013.01); *H01J 37/32366* (2013.01); *H01L 21/02167* (2013.01); *H01L 21/31116* (2013.01); *H01L 21/31144* (2013.01); *H01L 29/66795* (2013.01)

(58) Field of Classification Search
USPC ...................... 438/694, 710, 711; 216/58, 67
See application file for complete search history.

(56) References Cited

U.S. PATENT DOCUMENTS

| | | | |
|---|---|---|---|
| 7,560,756 B2 | 7/2009 | Chau et al. | |
| 7,714,397 B2 | 5/2010 | Hareland et al. | |
| 2004/0188239 A1* | 9/2004 | Robison et al. | 204/192.3 |
| 2005/0085082 A1* | 4/2005 | Dougan et al. | 438/704 |
| 2009/0283836 A1* | 11/2009 | Zhu et al. | 257/369 |
| 2010/0297838 A1* | 11/2010 | Chang et al. | 438/585 |
| 2011/0171804 A1* | 7/2011 | Wang et al. | 438/302 |
| 2011/0233170 A1* | 9/2011 | Yamazawa | 216/67 |
| 2011/0308733 A1* | 12/2011 | Mihara et al. | 156/345.33 |

OTHER PUBLICATIONS

International Search Report mailed Mar. 12, 2013 in PCT/JP2012/081838.

* cited by examiner

*Primary Examiner* — Shamim Ahmed
(74) *Attorney, Agent, or Firm* — Rothwell, Figg, Ernst & Manbeck, P.C.

(57) ABSTRACT

A plasma treatment device includes a dielectric window containing $SiO_2$. The insulating film to be etched comprises silicon carbonitride. In a first plasma treatment step, a processing gas which contains no oxygen gas and contains $CH_2F_2$, etc, is used to deposit a protective film. In a second plasma treatment step, a processing gas which contains oxygen gas and contains $CH_3F$, etc. is used to etch away the top and other portions of a part having a convex cross-sectional shape.

3 Claims, 13 Drawing Sheets

PLASMA TREATMENT METHOD AND PLASMA TREATMENT DEVICE

CROSS REFERENCE TO RELATED APPLICATION

This application is a 35 U.S.C. 371 National Phase Entry Application from PCT/JP2012/081838, filed Dec. 7, 2012, which claims priority to Japanese Patent Application No. 2012-014471, filed Jan. 26, 2012, the disclosures of which are incorporated herein in their entirety by reference.

FIELD OF THE INVENTION

The present invention relates to a plasma treatment method and a plasma treatment device for an insulating film that coats a part having a convex cross-sectional shape.

BACKGROUND OF THE INVENTION

A conventional field effect transistor has a two-dimensional shape in which a channel is formed on top of a flat surface of a semiconductor. However, recently, in order to improve features of a high speed operation and a low power consumption, a three-dimensional transistor in which a gate insulating film is provided so as to surround a fin-shaped semiconductor portion and a gate electrode is provided so as to surround the gate insulating film (see, e.g., Patent Document 1) starts to be practically used. The gate insulating film is made of, e.g., a high dielectric constant material (high-k material). As for the high dielectric constant material, there is known $TiO_2$, $ZrO_2$, $HfO_2$ or the like (see, e.g., Patent Document 2).

In the fin-shaped semiconductor portion, a transistor of a type in which two opposite side surfaces serve as carrier transfer channels is referred to as a double-gate transistor, and a transistor of a type in which a top surface as well as the two side surfaces serve as carrier transfer channels is referred to as a tri-gate transistor. There is suggested a semiconductor device having the double-gate transistor and the tri-gate transistor on a common substrate while utilizing advantages of the double-gate transistor and the tri-gate transistor (see, e.g., Patent Document 3).

The fin-shaped semiconductor portion protrudes from the substrate. Therefore, if the fin-shaped semiconductor portion is coated by the gate electrode, the corresponding semiconductor portion and the gate electrode have a part having a convex cross-sectional shape which is vertically formed on the substrate. In order to achieve insulation or protection, side surfaces of the part having a convex cross-sectional shape need to be coated by the insulating film.
Patent Document 1: U.S. Pat. No. 7,560,756
Patent Document 2: U.S. Pat. No. 7,714,397
Patent Document 3: U.S. Patent Application Publication No. 2010/0297838

In the case of forming the insulating film on the substrate including the part having a convex cross-sectional shape, the side surfaces of the part having the convex cross-sectional shape needs to be coated by the insulating film. However, a peripheral flat surface or a top surface of the part having a convex cross-sectional shape may not need to be coated by the insulating film because it decreases the flatness of the entire device and increases the thickness of the device. The present inventors have found that it is difficult to selectively coat the part having a convex cross-sectional shape because portions on the side surfaces are removed when portions on the flat surface of the insulating film are removed by plasma etching.

SUMMARY OF THE INVENTION

In view of the above, the present invention provides a plasma treatment method and a plasma treatment device which can remove an insulating film on top of a part having a convex cross-sectional shape and on peripheral portions thereof without removing an insulating film that coats side surfaces of the part having a convex cross-sectional shape.

In accordance with a first aspect of the present invention, there is provided a plasma treatment method for coating an insulating film on a surface of a substrate including a part having a convex cross-sectional shape which is erected on a substrate main body and performing plasma treatment on the insulating film, the method including: a first plasma treatment step of forming a protective film on a surface of the insulating film by performing first plasma treatment on the surface of the substrate; and a second plasma treatment step of removing the insulating film formed at a top portion of the part having a convex cross-sectional shape and peripheral portions thereof without removing the insulating film formed at both side surfaces of the part having a convex cross-sectional shape by performing second plasma treatment on the surface of the substrate, wherein the first plasma treatment step and the second plasma treatment step are performed by a plasma treatment device including a processing chamber in which the substrate is provided, a dielectric window containing $SiO_2$, and an antenna having a slot plate installed at one surface of the dielectric window, the plasma treatment device configured to convert a processing gas by supplying a processing gas to the vicinity of the dielectric window while supplying the microwave to the antenna and supply the plasma of the processing gas toward the surface of the substrate; wherein the insulating film is made of a silicon carbonitride; wherein the processing gas supplied into the processing chamber in the first plasma treatment step contains no oxygen gas and contains a fluorocarbon-based gas containing C and F; and the processing gas supplied into the processing chamber in the second plasma treatment step contains oxygen gas and the fluorocarbon-based gas containing C and F. The fluorocarbon-based gas supplied into the processing chamber in the first plasma treatment step may be at least one selected from a group consisting of $CH_2F_2$, $CH_3F$, $CHF_3$, $CF_4$, $C_5F$ and $C_4F_8$, and the fluorocarbon-based gas supplied into the processing chamber in the second plasma treatment step may be at least one selected from a group consisting of $CH_3F$, $CF_4$, $CHF_3$, $CH_2F_2$, $C_5F$ and $C_4F_8$.

In accordance with the plasma treatment method, in the first plasma treatment step, the fluorocarbon-based gas in the processing gas is turned into plasma by the microwave. At this time, a part of the fluorocarbon-based gas becomes radicals and the radicals flow toward the substrate. In the following, (*) indicates a free radical.

Generally, when a microwave energy for plasma generation is applied to $CH_2F_2$ as a fluorocarbon-based gas, $CH_2F_2$ is dissociated into $CHF_2$ (*) as free radicals and free proton H (*). If oxygen is added thereto, fluorine radicals (F (*)) are generated together with $CO_2$, $H_2O$ and the like. Especially, the fluorine radicals (F (*)) are bonded with silicon in silicon carbonitride forming the insulating film, and the free proton H (*) or oxygen (O) or oxygen radicals (O (*)) are bonded with nitrogen N or carbon C. Accordingly, the insulating film made of the silicon carbonitride is decomposed and etched.

As described above, the generation of the fluorine radicals (F (*)) contributing to the etching depends on oxygen (oxygen radicals).

Here, in the first plasma treatment step, a very small amount of oxygen (O) is added to the processing gas, instead of separately providing an oxygen gas. The very small amount of oxygen may be supplied from $SiO_2$ forming the dielectric window where the plasma is generated. The processing gas supplied into the processing chamber does not contain oxygen. When oxygen is generated by plasma etching of the dielectric window, a small amount of Si is generated from Si bonded with oxygen.

The silicon carbonitride is slightly etched by the plasma of the processing gas. Si or the like decomposed from the silicon carbonitride is bonded with a very small amount of oxygen and re-deposited to the surface of the part having a convex cross-sectional shape. Further, silicon oxide Si—O is formed on the surface of the insulating film coated at both side surfaces and deposited as a protective film on the insulating film.

Meanwhile, in the second plasma treatment step, a proper amount of oxygen is supplied as a processing gas. If the amount of oxygen contained in the processing gas is greater than the amount of oxygen supplied from the dielectric window, an etching rate tends to be higher than a deposition rate of the silicon oxide as the protective film.

When a microwave for plasma generation is applied to $CH_3F$ (methyl fluoride) as a fluorocarbon-based gas, $CH_3F$ is dissociated into $CH_2F$ (*) as free radicals and free proton H (*). If oxygen is added thereto, fluorine radicals F (*) are generated together with $CO_2$, $H_2O$ and the like, as in the case of $CH_2F_2$ (difluoromethane). Especially, bonding between fluorine radicals (F (*)) and silicon (Si) in silicon carbonitride forming the insulating film and bonding between the free proton H (*) or oxygen (O) or oxygen radicals (O (*)) and nitrogen (N) or carbon (C) result in decomposition and etching of the insulating made of silicon carbonitride.

Generally, oxygen (O) has a function of facilitating generation of fluorocarbon-based gas in the plasma by facilitating decomposition of fluorine radicals (F (*)). Since the fluorine radicals (F (*)) are easily bonded with Si forming the insulating film or the protective film, the insulating film made of silicon carbonitride (SiCN) is easily decomposed and etched, as described above. Although the etching also occurs in the protective film (Si—O), the insulating film is etched more than the protective film because the bonding energy of Si—N is smaller than the bonding energy of Si—O.

In the second plasma treatment step, the decomposition and the etching of the insulating film can be facilitated due to the bonding between fluorine (F) or fluorine radicals (F (*)) in the fluorocarbon-based gas and silicon (Si) in the insulating film and the bonding between carbon (C) or nitrogen (N) and oxygen (O) contained in the processing gas. Further, the protective film is also slightly etched due to the bonding between silicon (Si) in the protective film and fluorine (F) in the fluorocarbon-based gas and the bonding between oxygen (O) in the protective film and carbon (C) in the fluorocarbon-based gas.

However, the deposition rate of the silicon oxide in the first plasma treatment step is relatively higher in a surface parallel to a direction directed from a plasma generation position toward the substrate, i.e., both side surfaces of the part having a portion having a convex cross-sectional shape, than in a surface perpendicular to such the direction. The etching rate of the protective film in the second plasma treatment step has the opposite relationship. In other words, the etching rate of the protective film (Si—O) or the insulating film (Si—C—N) becomes high in the surface perpendicular to the direction directed from the plasma generation position below the dielectric window toward the substrate and becomes low in the surface parallel to the above direction. Therefore, the silicon oxide forming the protective film of the side surface is easily deposited in the first plasma treatment step and is hardly etched in the second plasma treatment step. Accordingly, the insulating film at both side surfaces of the part having a convex cross-sectional shape remains, and the insulating film on top of the part having a convex cross-sectional shape and a peripheral flat surface is removed.

In the first plasma treatment step, a first bias voltage may be applied to the substrate. And in the second plasma treatment step, a second bias voltage may be applied to the substrate. And the first bias voltage may be higher than the second bias voltage. In other words, as the bias voltage (bias power) is higher, acceleration of atoms forming the processing gas by the bias voltage occurs. Accordingly, the possibility of separation of Si causing deposits from the insulating film to the outside is increased, and the deposition rate of the silicon oxide forming the protective film is increased. Therefore, in the first plasma treatment step in which the bias voltage is high, the tendency of deposition of the silicon oxide becomes higher. In the second plasma treatment step in which the bias voltage is low, the tendency of deposition of the silicon oxide becomes relatively lower. Hence, in the first plasma treatment step, the silicon oxide is deposited on the sidewall. In the second plasma treatment step, the silicon carbonitride or silicon oxide is etched rather than deposited. The bias voltage is set to a voltage between a specific fixed potential (ground) and a substrate.

As for the fluorocarbon-based gas used in the first plasma treatment step, it is possible to use one or more gases selected from a group consisting of $CH_3F$, $CHF_3$, $CF_4$, $C_5F$ and $C_4F_8$ other than $CH_2F_2$.

As for the fluorocarbon-based gas used in the first plasma treatment step, it is possible to use one or more gases selected from a group consisting of $CH_4$, $CHF_3$, $CH_2F_2$, $C_5F$ and $C_4F_8$ other than $CH_3F$.

In accordance with a second aspect of the present invention, there is provided a plasma treatment device for performing the plasma treatment method described above, including: a gas supply source configured to supply the processing gas into the processing chamber; the antenna including the dielectric window and configured to convert the processing gas supplied into the processing chamber into a plasma; and a controller configured to control the gas supply source, wherein the controller controls the gas supply source to supply processing gases for the plasma treatment steps into the processing chamber so that the first plasma treatment step and the second plasma treatment step are carried out.

Effect of the Invention

In accordance with the plasma treatment method and the plasma treatment device, it is possible to remove the insulating film on top of the part having a convex cross-sectional shape and peripheral portions thereof without removing the insulating film coating the side surfaces of the part having a convex cross-sectional shape.

DETAILED DESCRIPTION OF THE EMBODIMENTS

Figure 1:
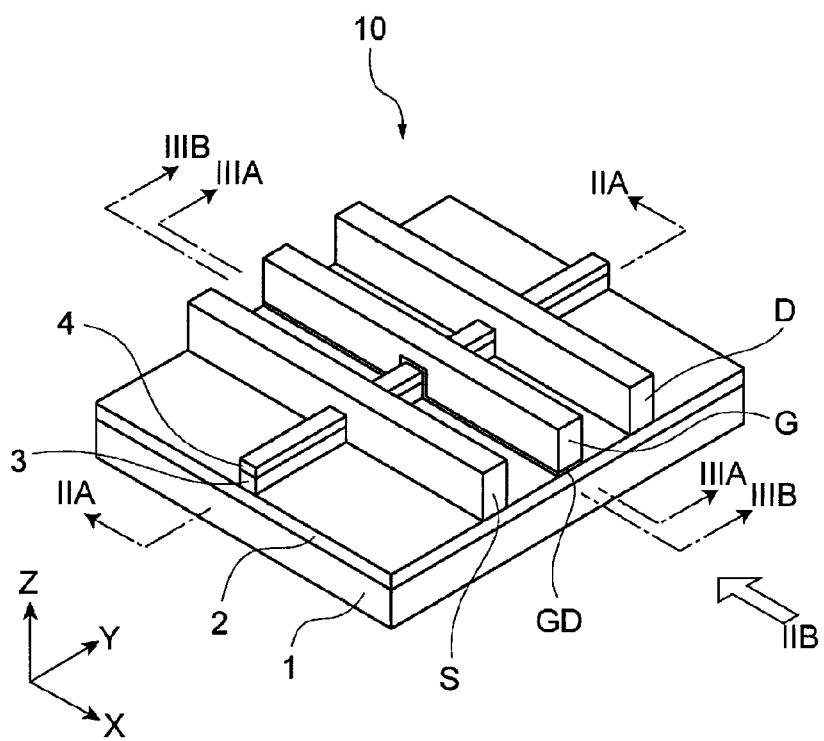
FIG. 1 is a perspective view of a fin-shaped transistor.

Hereinafter, embodiments of the present invention will be described with reference to the accompanying drawings. Further, like reference numerals will be used for like parts, and redundant description will be omitted.

FIG. 1 is a perspective view of a fin-shaped field effect transistor. In FIG. 1, a XYZ three-dimensional orthogonal coordinate system is used. A carrier flow direction in a transistor 10 is set to a Y-axis direction. A thickness direction of a substrate 1 is set to a Z-axis direction. A direction perpendicular to the Y-axis and the Z-axis is set to an X-axis direction.

The transistor 10 includes the substrate 1, an insulating film 2 formed on a main surface of the substrate 1, a fin-shaped semiconductor channel layer 3 formed on the insulating layer 2, a gate insulating film GD disposed around a lengthwise direction (Y-axis) of the semiconductor channel layer 3, and a gate electrode G in contact with the semiconductor channel layer 3 via the gate insulating film GD. A relatively thick upper insulating layer 4 is disposed on the gate insulating film GD formed on the top surface of the semiconductor channel layer 3.

The substrate 1 is a semiconductor substrate. In this example, the substrate 1 is a silicon substrate. The base insulating film 2 formed on the main surface of the substrate 1 is a buried oxide layer (so-called BOX layer) or a base insulating film in an SOI (Silicon On Insulator). In this example, the base insulating film 2 is made of $SiO_2$. The insulating layer 2 may be made of an insulator such as sapphire ($Al_2O_3$) or the like.

The semiconductor channel layer 3 is made of silicon, and the gate insulating film GD is made of a dielectric material having a high dielectric constant. As for the material having a high dielectric constant (high-k material), $TiO_2$, $ZrO_2$, $HfO_2$ or the like is known. The upper insulating layer 4 may be made of, e.g., $SiO_2$ or silicon nitride.

The gate electrode G may be made of a metal such as Au, Ag, Cu, Al or the like, a semiconductor such as polysilicon or the like, or a silicide. Although it is not particularly restricted, the gate electrode G is made of polysilicon in this example. In the case of using an electrode made of a semiconductor, it is preferable to add impurities so that metallic properties can be ensured. A source electrode S and a drain electrode D may be made of the same material as that of the gate electrode G. These electrodes are in contact with the semiconductor channel layer 3. The source electrode S and the drain electrode D as well as the gate electrode G extend along the X-axis direction, and the electrodes are arranged in a stripe pattern.

Conductive impurities different from the semiconductor channel layer 3 are added to a semiconductor region in contact with the source electrode S and the drain electrode D. If the semiconductor channel layer 3 is P-type and the semiconductor region in contact with the source electrode S and the drain electrode D is N-type, an N-type channel is formed in the semiconductor region in contact with the gate electrode G (NMOS transistor) by applying a positive potential to the gate electrode G. On the contrary, if the semiconductor region in contact with the source electrode S and the drain electrode D is P-type, a P-type channel is formed in the semiconductor region in contact with the gate electrode G (PMOS transistor) by applying a negative potential to the gate electrode G. In the case of forming the NMOS transistor and the PMOS transistor on the same substrate, a CMOS transistor is obtained. In that case, a plurality of electrodes greater in number than that shown in FIG. 1 is arranged in a stripe pattern.

Figure 2A:
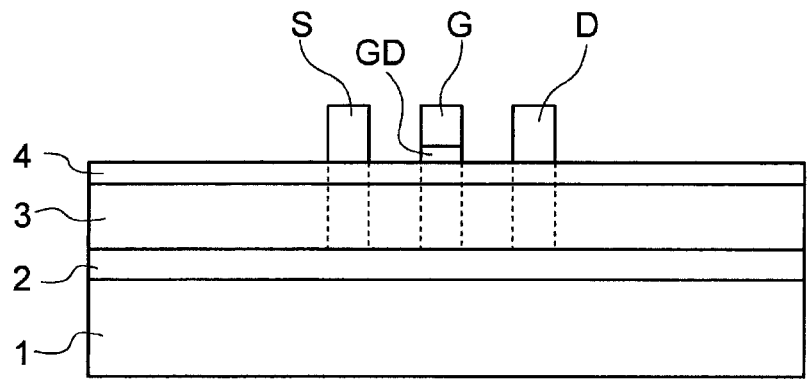
FIG. 2A is a cross sectional view of the transistor shown in FIG. 1 which is taken along arrows IIA-IIA and FIG. 2B is a front view seen from a direction of an arrow IIB.
Figure 2B:
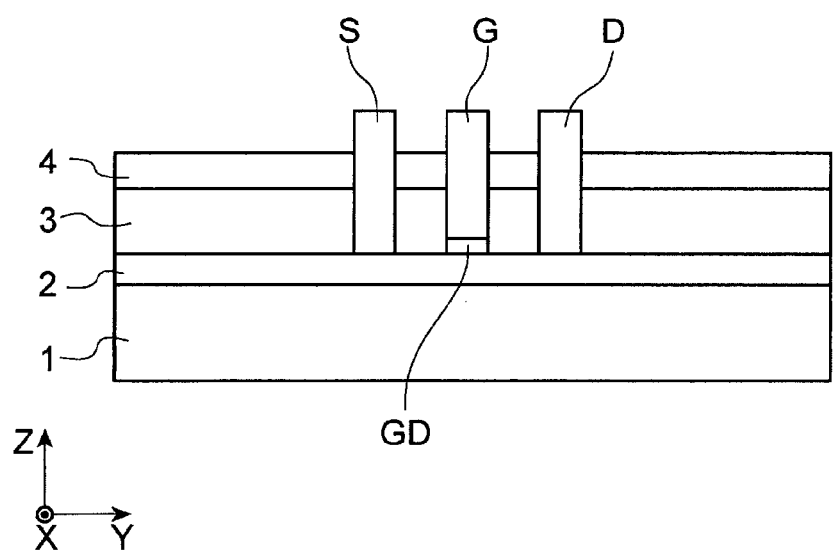

FIG. 2A is a cross sectional view of the transistor shown in FIG. 1 which is taken along arrows IIA-IIA and FIG. 2B is a front view seen from a direction of an arrow IIB.

As shown in FIG. 2B, at an outer side of the semiconductor channel layer 3, the gate insulating film GD is interposed between the base insulating film 2 and the gate electrode G while contacting them, and extends along the X-axis. As shown in FIG. 2A, at a side portion (YZ surface) of the semiconductor channel layer 3, the gate insulating film GD is interposed between the semiconductor channel layer 3 and the gate electrode G while contacting them. At the top portion, the gate insulating film GD is interposed between the upper insulating film 4 and the gate electrode G while contacting them.

The source electrode S and the drain electrode D are in contact with the semiconductor channel layer 3 at the side portion (YZ surface) of the semiconductor channel layer 3. Further, the source electrode S and the drain electrode D are in contact with the upper insulating film 4 formed on top of the semiconductor channel layer 3.

Figure 3A:
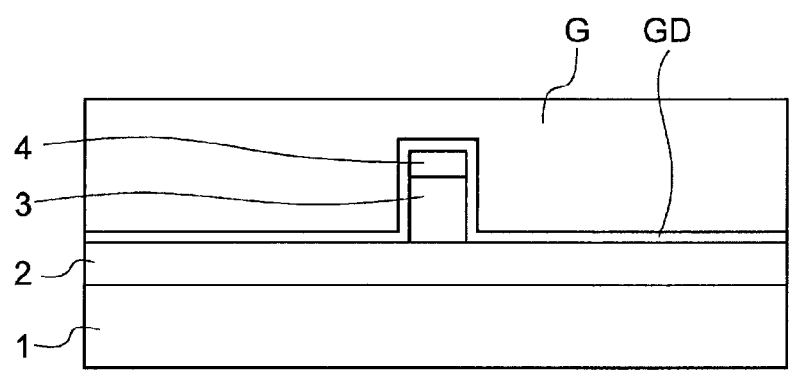
FIGS. 3A and 3B are cross sectional views of the transistor shown in FIG. 1 which are taken along arrows IIIA-IIIA and IIIB-IIIB, respectively.
Figure 3B:
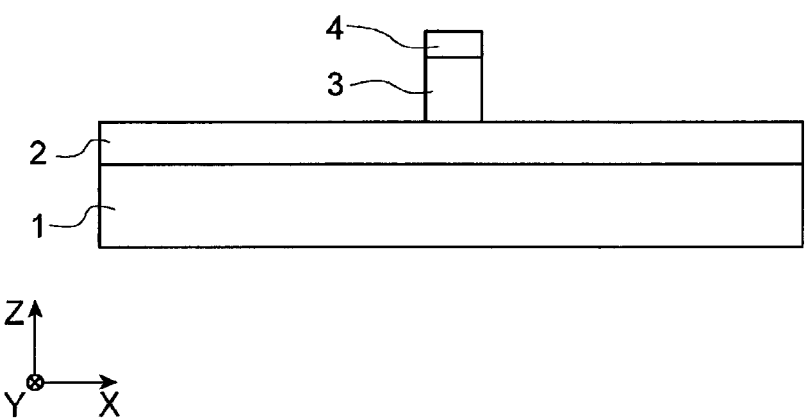

FIGS. 3A and 3B are cross sectional views of the transistor shown in FIG. 1 which are taken along arrows IIIA-IIIA and IIIB-IIIB, respectively.

As can be seen from the cross sectional view (FIG. 3A) penetrating through the gate electrode G, the semiconductor channel layer 3 and the upper insulating layer 4 are arranged in a rectangular shape in the XZ cross section. The gate insulating film GD extends along the X axis direction and covers the surface of the fin-shaped semiconductor channel layer 3 formed vertically along the Z-axis direction. As can be seen from the cross sectional view that does not penetrate through the gate electrode G (FIG. 3B), the gate insulating film GD is not formed at the outer region in the Y-axis direction of the gate electrode G.

Next, a step of coating a fin structure by an insulating film and performing plasma treatment thereon will be described.

Figure 4:
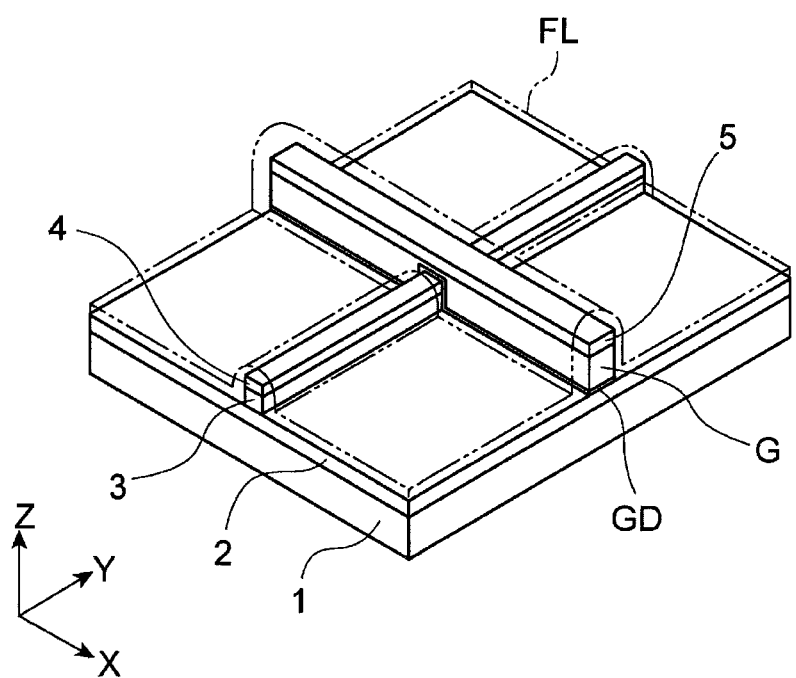
FIG. 4 is a perspective view of a single fin structure forming the transistor.

FIG. 4 is a perspective view of a single fin structure forming the transistor. In other words, only the gate structure shown in FIG. 1 is selected for clear description in FIG. 4. The entire top surface of the semiconductor substrate 1 is coated by an insulating film FL. The insulating film FL, except portions formed at the sidewall of the part having a convex cross-sectional shape is removed by the plasma treatment method of the present embodiment. The step of forming an insulating film formation and performing plasma treatment is applied to the transistor using a plurality of the fin structures shown in FIG. 1.

The insulating film FL is made of a silicon nitride SiCN. The insulating film FL may be formed by a chemical vapor deposition (CVD) method, a plasma enhanced chemical vapor deposition (PECVD) method or a sputtering method. In the PECVD method, SiCN may be deposited on the substrate by converting $NH_3$ gas, $SiH_4$ gas and $CH_4$ gas into a plasma, for example. In the sputtering method, an SiCN film may be easily deposited on the substrate by using an SiCN substrate as a sputtering target.

The deposited insulating film FL is amorphous. The insulating film FL coats the part having a convex cross-sectional shape and the surface of the base insulating film 2 formed on the substrate 1. In FIG. 4, the part having a convex cross-sectional shape is positioned at two locations. One is the fin-shaped semiconductor channel layer 3 and the other is the gate electrode G. Both form the part having a convex cross-sectional shape which is erected on the substrate. The plasma treatment can be performed on any of the two parts. In the following, a step of performing plasma treatment on the gate electrode G will be described.

The plasma treatment for the insulating film FL includes the first plasma treatment step and the second plasma treatment step and is performed by using a plasma treatment device to be described later.

Figure 5:
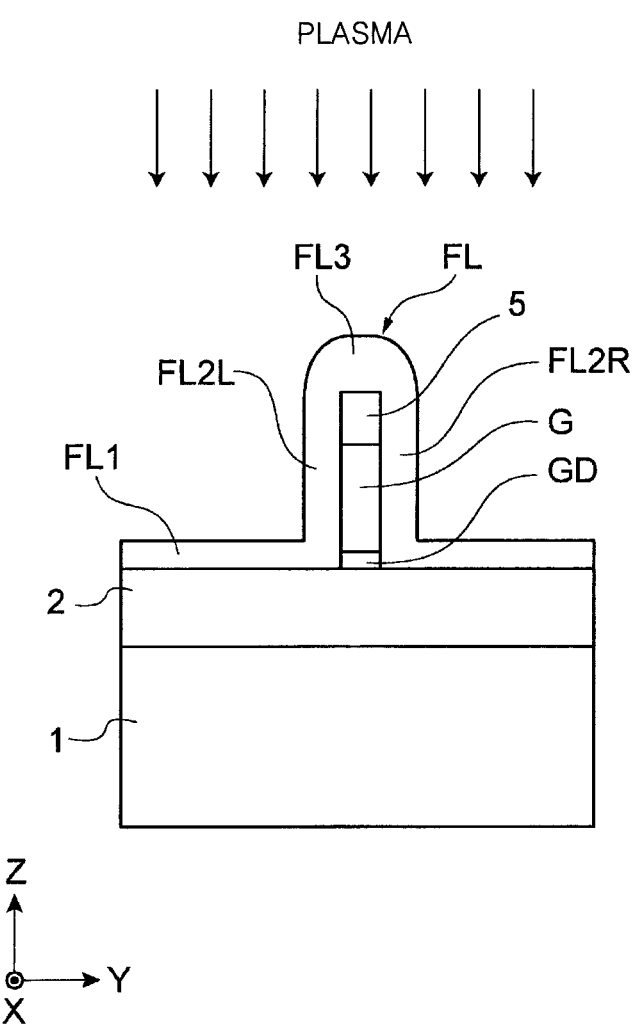
FIG. 5 is a vertical cross sectional view of a substrate which explains a first plasma treatment step in an example.

FIG. 5 is a vertical cross sectional view (cross section taken along arrows V-V: YZ cross section) of the substrate which explains the first plasma treatment step of the present embodiment.

The insulating film FL that coats the part having a convex cross-sectional shape is formed on the substrate 1 via the base insulating film 2. The part having a convex cross-sectional shape is formed by depositing the gate insulating film GD, the gate electrode G and an upper insulating film 5 in that order. The insulating film FL includes an insulating region FL1 in contact with the base insulating film 2, insulating regions FL2L and FL2R in contact with both side surfaces of the part having a convex cross-sectional shape and an insulating region FL3 that coats the top portion of the part having a convex cross-sectional shape. The insulating regions are continuously extended.

In the first plasma treatment step, the substrate is provided in the processing chamber of the plasma treatment device, and the protective film is formed on the insulating film FL by the plasma treatment device. In order to form the protective film, the plasma of the processing gas which is obtained by irradiating a microwave to the processing gas is guided to the surface of the substrate. Here, an antenna for radiating a microwave electric field includes a dielectric window and a metal slot plate opposite to each other. The dielectric window is made of quartz ($SiO_2$). The processing gas is turned into a plasma in the region directly below the dielectric window. At this time, the dielectric window is slightly etched by the processing gas.

The processing gas supplied into the processing chamber in the first plasma treatment step does not contain $O_2$ gas, but contains a fluorocarbon-based gas. As for the fluorocarbon-based gas, it is possible to use one or more gases selected from a group consisting of $CH_2F_2$, $CH_3F$, $CHF_3$, $CF_4$, $C_5F$ and $C_4F_8$.

The followings are conditions for the first plasma treatment step of the present embodiment. A processing temperature is set to a room temperature.

(1) gases contained in the processing gas:
Ar
$CH_2F_2$ (difluoromethane)
(2) flow rates of processing gases:
Ar: 1000 sccm
$CH_2F_2$: 5 sccm
(3) Pressure in the Processing Chamber:
20 mTorr (=2.7 Pa)
(4) microwave power:
2000 W (frequency of microwave=2.45 GHz)
(5) microwave power (W1): 450 W
(6) RDC value: 55
(7) processing time: 8 sec The processing gas is branched into two streams by a branch unit installed in an inlet line extending to the processing chamber. One is introduced into a peripheral inlet portion disposed at a periphery of a space between the substrate and the antenna. The other one is introduced into a central inlet portion disposed above the center of the substrate. A technique for controlling the amount of gases introduced from the central inlet portion or the peripheral inlet portion is referred to as "RDC" (Radical Distribution Control). Here, the RDC value is expressed as a ratio (GC/GP) of the amount of gas introduced from the central inlet portion with respect to the amount of gas introduced from the peripheral inlet portion.

The bias power W1 is consumed by a voltage V1 applied to the substrate, and the voltage V1 is an AC voltage having a frequency of 13.56 MHz. The bias power is supplied from a bias power source BV (see FIG. 10).

In accordance with the plasma treatment method, in the first plasma treatment step, the fluorocarbon-based gas ($CH_2F_2$ in this example) in the processing gas is turned into a plasma by the microwave. At this time, a part of the fluorocarbon-based gas becomes radicals, and the radicals flow toward the substrate.

In general, when the microwave is applied to $CH_2H_2$ as the fluorocarbon-based gas, $CH_2H_2$ is decomposed into $CHF_2$ as free radicals and free protons H (*) to be described below. (*) indicates free radicals.

$$CH_2F_2 \rightarrow CHF_2(*)+H(*)$$

If oxygen (or oxygen radicals) is added to the processing gas ($CHF_2(*)+H(*)$), fluorine radicals F (*) are generated together with $CO_2$ and $H_2O$.

The insulating film FL is made of SiCN. The fluorine radicals F (*) in SiCN are bonded with Si (Si—F). The free protons H(*) or oxygen (O) or oxygen radicals (O(*)) are bonded with N and C, thereby generating $CO_2$, $H_2O$, $NH_3$ or the like. Accordingly, the insulating film FL made of SiCN is etched.

Here, in the first plasma treatment step, the processing gas contains a very small amount of oxygen (O), so that an oxygen gas may not be provided separately. The very small amount of oxygen gas is supplied from $SiO_2$ forming the dielectric window. The processing gas supplied into the processing chamber may not contain oxygen. When oxygen is generated by plasma etching of the dielectric window, a very small amount of Si is generated from Si bonded with oxygen.

In the insulating film FL made of SiCN, the surface thereof, especially the insulating region FL1 in contact with the base insulating film 2, is slightly etched by the plasma of the processing gas. Si or the like decomposed therefrom is bonded with a very small amount of oxygen and re-deposited to the surface of the insulating film FL that coats the part having a convex cross-sectional shape.

Figure 6:
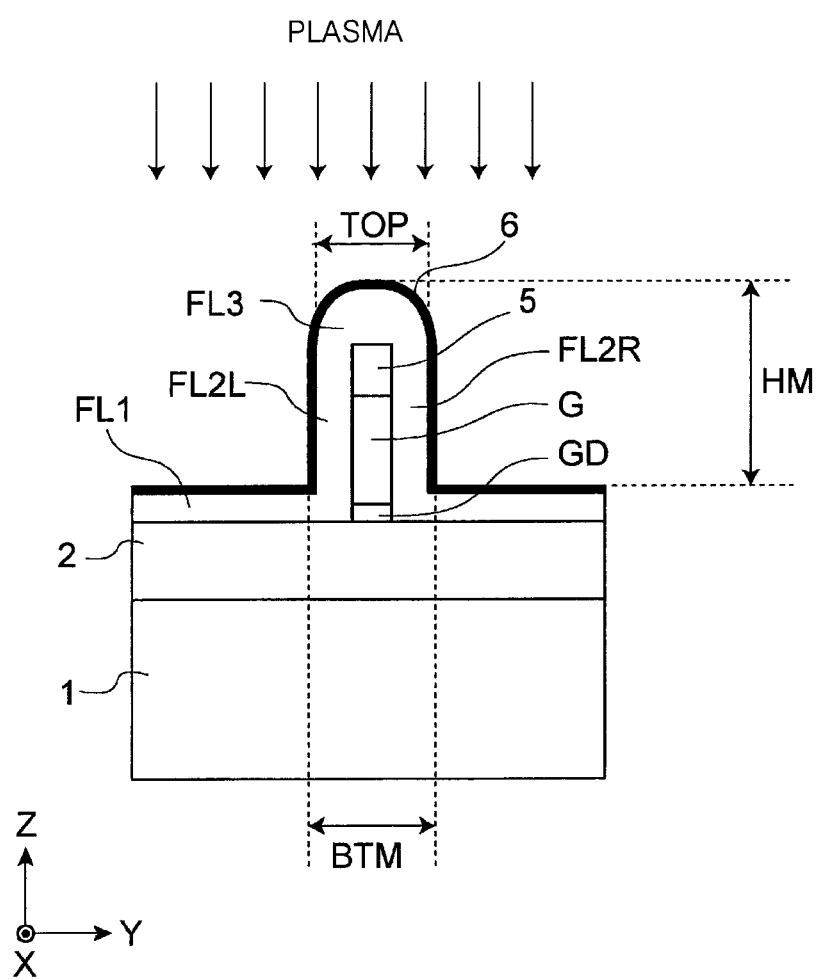
FIG. 6 is a vertical cross sectional view of the substrate which explains the first plasma treatment step in the example.

FIG. 6 is a cross sectional view of a substrate which explains the first plasma treatment step of the present embodiment.

As a result of the first plasma treatment step, silicon oxide (Si—O) is formed at least on the surface of the insulating film FL at both side surfaces of the part having a convex cross-sectional shape and deposited as the protective film 6 on the insulating film FL. As for the silicon oxide, SiO and $SiO_2$ are well-known. The protective film 6 is mainly made of SiO or $SiO_2$.

Figure 7:
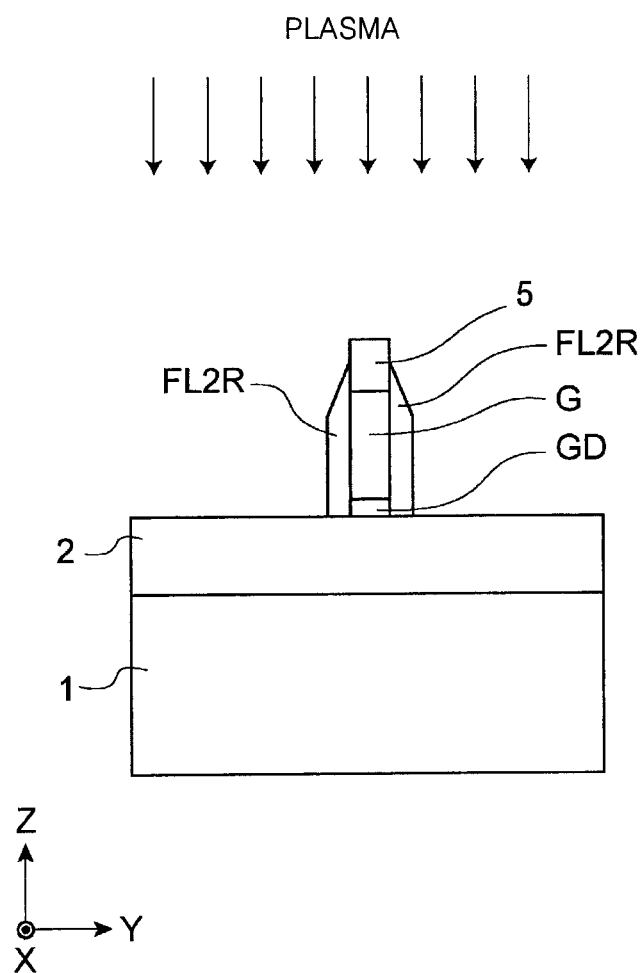
FIG. 7 is a vertical cross sectional view of a substrate which explains a second plasma treatment step in the example.

FIG. 7 is a vertical cross sectional view of a substrate which explains the second plasma treatment step of the present embodiment.

In the second plasma treatment step, a proper amount of oxygen is supplied as a processing gas.

The followings are conditions for the second plasma treatment step. A processing temperature is set to a room temperature.

(1) gases contained in the processing gas:
Ar
$CH_3F$ (methyl fluoride)
$O_2$
CO
(2) flow rates of processing gases:
Ar: 200 sccm
$CH_2F_2$: 45 sccm
$O_2$: 37 sccm
CO: 100 sccm
(3) pressure in the processing chamber:
45 mTorr (=6.07 Pa)
(4) microwave power:
2000 W (frequency of microwave=2.45 GHz)
(5) bias power (W2): 30 W
(6) RDC value: 5
(7) processing time: 70 sec The bias power W2 is consumed by a voltage V2 applied to the substrate. The voltage V2 is an AC voltage having a frequency of 13.56 MHz.

In the second plasma treatment step, if the amount of oxygen contained in the processing gas is greater than the amount of oxygen supplied from the dielectric window, the etching rate of the silicon oxide tends to be higher than the deposition rate of the silicon oxide. This tendency is remarkable in the region except the sidewall of the part having a convex cross-sectional shape.

When a microwave is applied to $CH_3F$ (methyl fluoride) as a fluorocarbon-based gas, $CH_3F$ is dissociated into $CH_2F$ (*) as free radicals and free protons H(*). If oxygen (or oxygen radicals) is added to the dissociated processing gas ($CH_2F$(*)+H(*)), fluorine radicals F(*) are generated together with $CO_2$ and $H_2O$, as in the case of $CH_2F_2$ (difluoromethane).

The fluorine radicals F(*) are bonded with silicon Si in SiCN forming the dielectric window. The free protons H(*) or oxygen (O) or oxygen radicals (O(*)) are bonded with N and C. Accordingly, the insulating film FL made of SiCN is decomposed and etched.

Oxygen (O) has a function of facilitating generation of fluorine radicals F(*) by facilitating dissociation of the fluorocarbon-based gas in the plasma. The fluorine radicals F(*) are easily bonded with Si forming the protective film 6 (SiO) and insulating film FL (SiCN), so that the insulating film FL made of SiCN is easily etched as described above. Although the etching also occurs in the protective film (Si—O), the insulating film FL is etched more than the protective film 6 because the bonding energy between Si—N is smaller than that between Si—O.

In the second plasma treatment step, the processing gas contains oxygen, so that fluorine (F) or fluorine radicals (F (*)) in the fluorocarbon-based gas are bonded with silicon (Si) in the insulting film FL (SiCN). Further, carbon (C) in the insulating film FL or nitrogen (N) is bonded with oxygen (O) (including radicals). Hence, the decomposition and the etching of the insulating film FL are facilitated. Silicon (Si) in the protective film 6 is bonded with fluorine (F) in the fluorocarbon-based gas, and oxygen (O) in the protective film 6 is bonded with carbon (C) in the fluorocarbon-based gas. Accordingly, the protective film 6 is also slightly etched.

The deposition rate of the silicon oxide in the first plasma treatment step is relatively higher in a surface (e.g., XZ plane) parallel to a direction (−Z direction) directed from the plasma generation position toward the substrate, i.e., both side surfaces of the part having a convex cross-sectional shape, than in a surface (XY plane) perpendicular to the direction. The etching rate of the protective film 6 in the second plasma treatment step has the opposite relationship. In other words, the etching rate of the protective film 6 (Si—O) or the insulating film FL (Si—C—N) becomes high in the surface (XY plane) perpendicular to the direction (−Z direction) directed from the plasma generation position below the dielectric window toward the substrate and becomes low in the surface parallel thereto (e.g., XZ plane).

As a consequence, the silicon oxide forming the protective film 6 at the side surfaces is easily deposited in the first plasma treatment step and is hardly etched in the second plasma treatment step. Therefore, the insulating film formed at both side surfaces of the part having a convex cross-sectional shape remains, and the insulating film FL formed on the top surface of the part having a convex cross-sectional shape and the peripheral flat surface thereof is removed.

As the processing time is increased, the protective film 6 and the insulating film FL2L and FL2R formed at the side surfaces are etched. When the protective film 6 at the side surfaces is removed, the thicknesses of the insulating films FL2L and FL2R at the side surfaces are greater than those of the insulating films FL1 and FL3 in other regions (see FIG. 6). Therefore, the insulating film FL2L and FL2R at the side surfaces can remain even after the insulating films FL1 and FL3 are completely removed (see FIG. 7). In FIG. 7, the insulating film remains on the gate electrode G.

In the first plasma treatment step, the first bias voltage V1 is applied to the substrate. In the second plasma treatment step, the second bias voltage V2 is applied to the substrate. The bias voltage is set to a voltage between a specific fixed potential (ground) and the substrate.

Here, the first bias voltage V1 is higher than the second bias voltage V2. As the bias voltage (the bias power W1 or W2) becomes higher, acceleration of atoms forming the processing gas by the bias voltage occurs. Therefore, the possibility of separation of Si causing deposits from the insulating film to the outside is increased. Since Si is supplied, the deposition rate of the silicon oxide forming the protective film 6 is increased. Such a tendency occurs even when no bias power is supplied because the processing gas flows toward the substrate.

Therefore, in the first plasma treatment step in which the bias voltage is high, the deposition of the silicon oxide tends to be increased. In the second plasma treatment step in which the bias voltage is low, the deposition of the silicon oxide tends to be decreased. Accordingly, in the first plasma treatment step, the silicon oxide is deposited. In the second plasma treatment step, silicon carbonitride or silicon oxide is etched rather than deposited. The bias power in the first plasma treatment step is preferably about 100 W or above and about 0.14 W/cm² or above in order to reduce the time required to form the protective film.

Next, a comparative example will be described.

In the comparative example, a single plasma treatment step was performed on a substrate having thereon an insulating film, instead of the two plasma treatment steps. In other words, in the comparative example, only the second plasma treatment step was performed without performing the first plasma treatment step.

Figure 8:
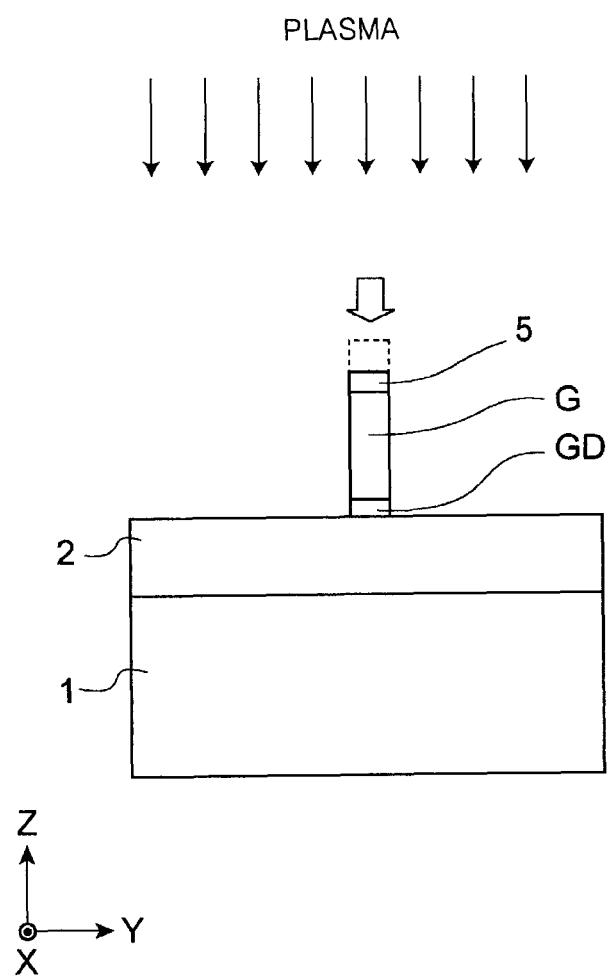
FIG. 8 is a vertical cross sectional view of a substrate which explains a plasma treatment step in a comparative example.

FIG. 8 is a vertical cross sectional view of the substrate which explains the plasma treatment step in the comparative example.

In the comparative example, an insulating film formed at side surfaces of a part having a convex cross-sectional shape was completely removed when an insulating film formed at other peripheral portions was removed, and the side surface of the gate electrode G was exposed, as shown in FIG. 8. The upper insulating layer 5 was etched by a direction indicated by an arrow, so that the height thereof was reduced.

Figure 9:
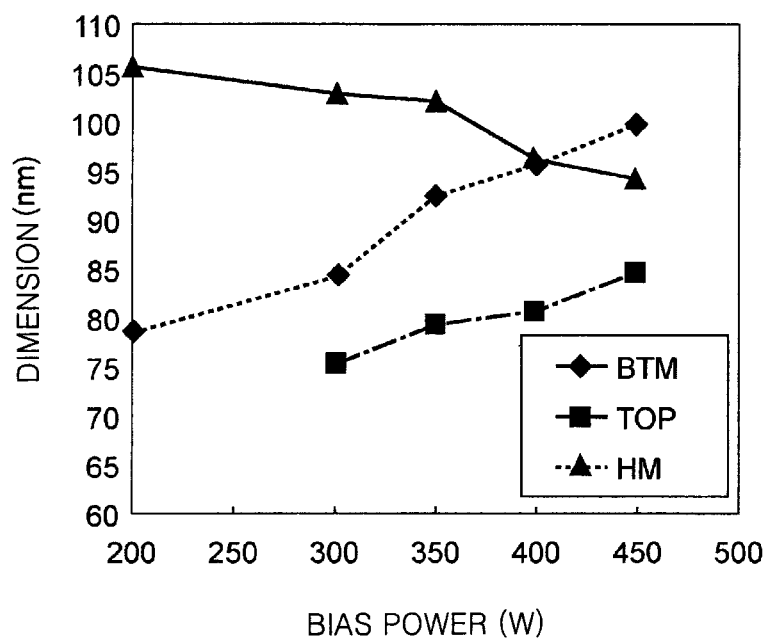
FIG. 9 is a graph showing relationship between a bias power W and various dimensions of a part having a convex cross-sectional shape.

FIG. 9 is a graph showing relationship between the bias power W in the first plasma treatment step and various dimensions of the part having a convex cross-sectional shape.

Here, the bias power W in the first plasma treatment step of the example was changed, and the processing time was set to about 20 sec in order to maximize deposition of a protective film. The other conditions were the same as those of the example.

In the graph shown in FIG. 9, BTM represents a width (dimension in the Y-axis direction) of the lower portion of the part having a convex cross-sectional shape including the protective film 6 shown in FIG. 6; TOP represents a width (dimension in the Y-axis direction) of the vicinity of the apex portion (measured at a position corresponding to 90% of the height of the apex portion before forming the protective film on the part having a convex cross-sectional shape) of the part having a convex cross-sectional shape including the protective film 6 shown in FIG. 6; and MH represents a height from the exposed bottom surface to the top surface of the part having a convex cross-sectional shape including the protective film 6.

As can be seen from the graph, as the bias power is increased, the thickness of the protective film 6 is increased (dimensions of the part having a convex cross-sectional portion before the formation of the protective film 6: BTM=74 nm, TOP=70 nm).

In the case of performing the first plasma treatment step and the second plasma treatment step, the insulating film FL remains only at the side surfaces of the part having a convex cross-sectional shape.

The flow rate of the fluorocarbon-based gas is smaller in the first plasma treatment step than in the second plasma treatment step.

In the above, there has been described the case of performing plasma treatment on the insulating film FL that coats the gate electrode as the part having a convex cross-sectional shape. However, the case of performing plasma treatment on an insulating film that coats the fin-shaped semiconductor channel layer as the part having a convex cross-sectional shape is the same as the above in that the part having a convex cross-sectional shape is coated by the insulating film. Therefore, as in the above-described case, the insulating film FL formed at the side surfaces can remain after the plasma treatment in the example, and the insulating film FL formed at the side surfaces cannot remain after the plasma treatment in the comparative example.

As for the fluorocarbon-based gas used in the first plasma treatment step, it is possible to use, other than $CH_2F_2$, at least one selected from a group consisting of $CH_3F$, $CHF_3$, $CF_4$, $C_5F$ and $C_4F_8$.

As for the fluorocarbon-based gas used in the second plasma treatment step, it is possible to use, other than $CH_3F$, at least one selected from a group consisting of $CF_4$, $CHF_3$, $CH_2F_2$, $C_5F$ and $C_4F_8$.

As described above, in accordance with the plasma treatment method, it is possible to remove the insulating film formed at the top portion of the part having a convex cross-sectional shape and the peripheral portions thereof without removing the insulating film that coats the side surfaces of the part having a convex cross-sectional shape.

Next, the plasma treatment device for performing the plasma treatment will be described.

Figure 10:
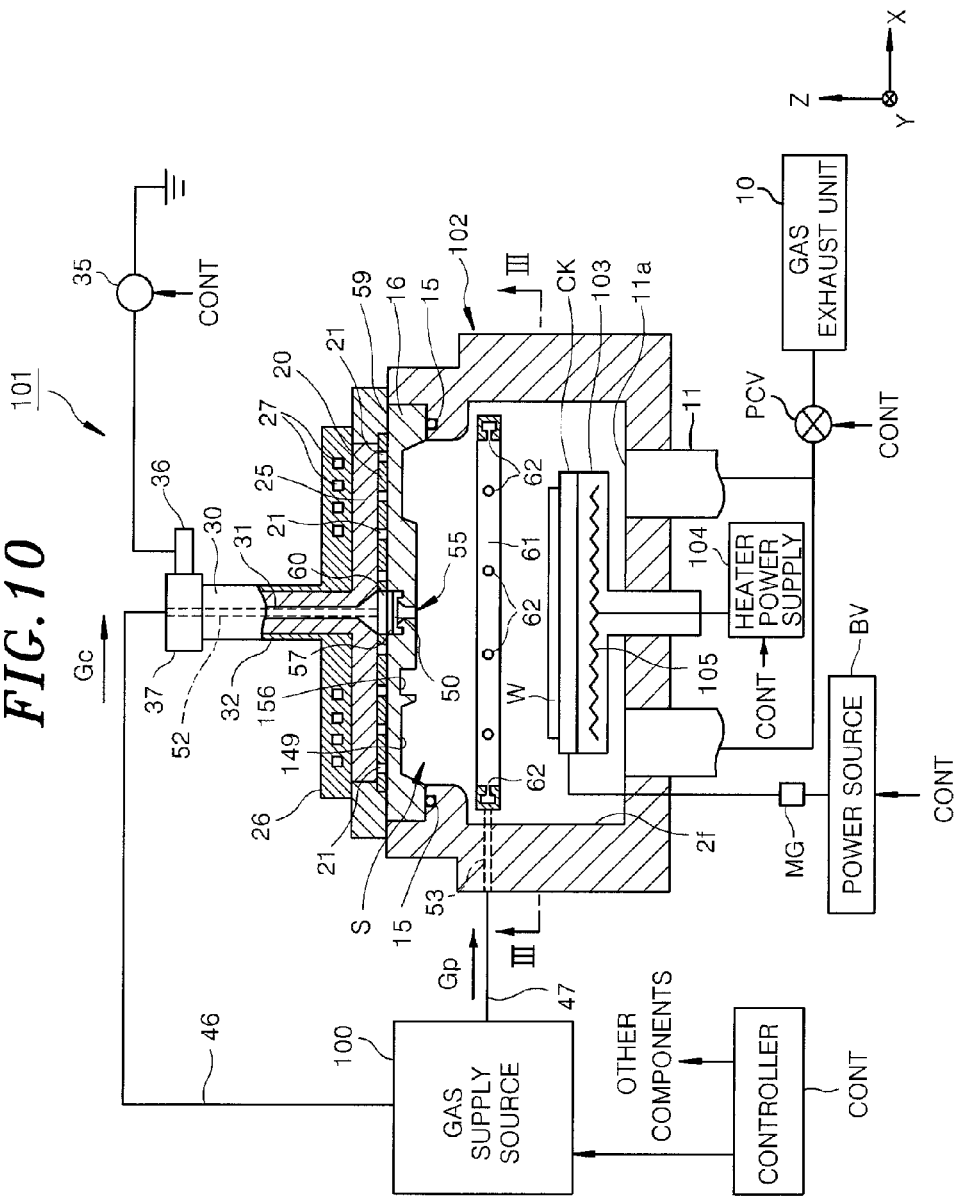
FIG. 10 is a view for explaining a vertical cross sectional structure of a plasma treatment device.

FIG. 10 is a view for explaining a vertical cross sectional structure of the plasma treatment device.

A plasma treatment device 101 includes a cylindrical processing chamber 102. A ceiling portion of the processing chamber 102 is blocked by a dielectric window (ceiling plate) 16 made of a dielectric material. The processing chamber 102 is made of, e.g., aluminum, and is electrically grounded. An inner wall surface of the processing chamber 102 is coated by an insulating protective film 2f such as alumina or the like.

A stage 103 for mounting thereon a semiconductor wafer (hereinafter, referred to as "wafer") W as a substrate is provided at a bottom central portion of the processing chamber 102. The wafer W is held on a top surface of the stage 103. The stage 103 is made of a ceramic material such as alumina or aluminum nitride. A heater 105 is buried in the stage 103, so that the wafer W can be heated to a predetermined temperature. The heater 105 is connected to a heater power supply 104 through a wiring provided in a columnar portion.

An electrostatic chuck CK for electrostatically holding the wafer W mounted on the stage 103 is provided on the top surface of the stage 103. The electrostatic chuck CK is connected to a bias power source BV for applying a high frequency power or a bias DC current via a matching unit MG.

Installed at a bottom portion of the processing chamber 102 is a gas exhaust line 11 for exhausting the processing gas through a gas exhaust port 11a disposed at a position lower than the surface of the wafer W mounted on the stage 103. A gas exhaust unit 10 such as a vacuum pump or the like is connected to the gas exhaust line 11 via a pressure control valve PCV. The gas exhaust unit 10 communicates with an inside of the processing chamber 102 through the pressure control valve PCV. The pressure in the processing chamber 102 is controlled to a predetermined level by the pressure control valve PCV and the gas exhaust unit 10.

The dielectric window 16 is installed at the ceiling portion of the processing chamber 102 through a sealing 15 for ensuring airtightness, such as an O-ring or the like. The dielectric window 16 is made of a dielectric material such as quartz ($SiO_2$). The dielectric window 16 transmits a microwave.

A circular plate-shaped slot plate 20 is provided on a top surface of the dielectric window 16. The slot plate 20 is made of a conductive material, e.g., Cu plated or coated by Ag, Au or the like. A plurality of slots 21 having a T-shape or an L-shape, for example, is concentrically arranged at the slot plate 20.

A dielectric plate 25 for compressing a wavelength of a microwave is provided on the top surface of the slot plate 20. The dielectric plate 25 is made of a dielectric material, e.g., quartz ($SiO_2$), alumina ($Al_2O_3$), or aluminum nitride (AlN). The dielectric plate 25 is covered by a conductive cover 26. A ring-shaped heat medium channel 27 is formed in the cover 26. The cover 2 and the dielectric plate 25 are controlled to a predetermined temperature by a heat medium flowing through the heat medium channel 27. In case of a microwave of 2.45 MHz, for example, a wavelength in vacuum is about 12 cm and a wavelength in the dielectric window 16 made of alumina is about 3 cm to 4 cm.

A coaxial waveguide 30 for propagating a microwave is connected to the center of the cover 26. The coaxial waveguide 30 includes an inner conductor 31 and an outer conductor 32. The inner conductor 31 is connected to the center of the slot plate 20 while penetrating through the center of the dielectric plate 25.

The coaxial waveguide 30 is connected to a microwave generator 35 via a mode converter 37 and a rectangular waveguide 36. Microwaves of 860 MHZ, 915 MHz or 8.35 GHz may be used instead of the microwave of 2.45 GHz.

A microwave generated by the microwave generator 35 propagates into the rectangular waveguide 36 as a microwave inlet line, the mode converter 37, the coaxial waveguide 30 and the dielectric plate 25. The microwave propagated into the dielectric plate 25 is supplied into the processing chamber 2 through a plurality of the slots 21 of the slot plate 20 and the dielectric window 16. An electric field is formed under the dielectric window 16 by the microwave, and a processing gas in the processing chamber 2 is turned into a plasma.

A lower end of the inner conductor 31 connected to the slot plate 20 has a truncated circular cone shape. Accordingly, the microwave can efficiently propagate from the coaxial waveguide 30 to the dielectric plate 25 and the slot plate 20 without a loss.

The microwave plasma generated by the radial line slot antenna is characterized in that a plasma having a relatively high electron temperature is diffused in a region directly below the dielectric window 16 (hereinafter, referred to as "plasma exciting region") and a plasma having a relatively low electron temperature of about 1 eV to 2 eV is diffused in a region directly above the wafer W (hereinafter, referred to as "plasma diffusion region"). In other words, the microwave plasma generated by the radial line slot antenna is different from the plasma generated by the parallel plate or the like in that the electron temperature distribution of the plasma is represented as a function of a distance from the dielectric window 16.

More specifically, the electron temperature of several eV to about 10 eV directly below the dielectric window 16 decreases to about 1 eV to 2 eV directly above the wafer W. Since the wafer W is processed in the region (plasma diffusion region) where the electron temperature of the plasma is low, damage such as a recess or the like inflicted on the wafer W is reduced. If the processing gas is supplied to the region (plasma exciting region) where the electron temperature of the plasma is high, the processing gas is easily excited and dissociated. If the processing gas is supplied to the region where the electron temperature of the plasma is low (the plasma diffusion region), the degree of dissociation is decreased compared to the case where the processing gas is supplied to the vicinity of the plasma exciting region.

A central inlet unit 55 for introducing the processing gas to the central portion of the wafer W is provided at the center of the dielectric window 16 in the ceiling portion of the processing chamber 102. A processing gas supply line 52 is formed in the inner conductor 31 of the coaxial waveguide 30. The central inlet unit 55 is connected to the supply line 52.

The central inlet unit 55 includes: a cylindrical block 57 inserted into a cylindrical space 143 (see FIG. 13) provided at the center of the dielectric window 16; a gas storage 60 formed between a bottom surface of the inner conductor 31 of the coaxial waveguide 30 and a top surface of the block 57 with proper distances therebetween; and a tapered space 143a (see FIG. 13) that is continuous to a cylindrical space having a gas injection opening at a leading end thereof.

The block 57 is made of a conductive material such as aluminum or the like and is electrically grounded. A plurality of central inlet openings 58 penetrates through the block 57 in a vertical direction. The central inlet openings 58 have a circular or elongated hole shape when seen from the top in consideration of a required conductance or the like. The block 57 made of aluminum is coated by anodically oxidized alumina ($Al_2O_3$), yttria ($Y_2O_3$) or the like.

The shape of the space 143a (see FIG. 13) is not limited to a tapered shape and may be simply a cylindrical shape.

The processing gas supplied into the gas storage 60 through the supply line 52 penetrating through the inner conductor 31 is diffused in the gas storage 60 and then injected downward toward the central portion of the wafer W through the central inlet openings 58 of the block 57.

In the processing chamber 2, a ring-shaped peripheral inlet unit 61 for supplying a processing gas to a peripheral portion of the wafer W is provided so as to surround the periphery of the space above the wafer W. The peripheral inlet unit 61 is positioned below the central inlet openings formed at the ceiling portion and above the wafer W mounted on the stage 103. The peripheral inlet unit 61 is a ring-shaped hollow pipe, and a plurality of peripheral inlet openings 62 spaced apart from each other at a regular interval in a circumferential direction is formed at an inner peripheral side of the peripheral inlet line 61.

The processing gas is injected through the peripheral inlet openings 62 toward the center of the peripheral inlet unit 61. The peripheral inlet unit 61 is made of, e.g., quartz. A supply line 53 made of stainless steel penetrates through the sidewall of the processing chamber 102. The supply line 53 is connected to the peripheral inlet unit 61. The processing gas supplied into the peripheral inlet unit 61 through the supply line 53 is diffused in an inner space of the peripheral inlet unit 61 and then injected toward the inner side of the peripheral inlet unit 61 through the peripheral inlet openings 62. The processing gas injected through the peripheral inlet openings 62 is supplied to a space above the peripheral portion of the wafer W. Instead of providing the ring-shaped peripheral inlet unit 61, a plurality of peripheral inlet openings 62 may be formed at the inner surface of the processing chamber 102.

A gas supply source 100 supplies the processing gas into the processing chamber 102. The gas supply source 100 includes two gas lines 46 and 47 extending to the outside. The gas supply source 100 has a plurality of source gas supply sources. Lines from the source gas supply sources are properly branched and joined, and finally, the two gas lines 46 and 47 extend to the outside. The first gas line 46 is connected to the central inlet unit 55 through the supply line 52 and supplies a central inlet gas Gc to the central inlet unit 55. The second gas line 47 is connected to the peripheral inlet unit 61 through the supply line 53 and supplies a peripheral inlet gas Gp to the peripheral inlet unit 61. In other words, a processing gas supplied from the gas line 46 is introduced to the central inlet unit 55 and a processing gas supplied from the gas line 47 is introduced to the peripheral inlet unit 61 located in a peripheral portion of a space between the wafer W and the antennas 16 and 20.

The gas supply source 100 has a flow rate control valve, so that flow rates of gases flowing in the gas lines 46 and 47 can be controlled.

A controller CONT shown in FIG. 10 controls the flow rate control valve in the gas supply source 100 to control a flow rate and a partial pressure ratio of a specific gas contained in the gases Gc and Gp respectively flowing in the gas lines 46 and 47. For example, a mixing ratio of various source gases flowing in the gas lines 46 and 47 is controlled by controlling the source gas flow rate control valves provided in the gas lines 46 and 47 connected to all the source gas lines. In this device, it is possible to change gas types or partial pressures of the central inlet gas Gc and the peripheral inlet gas Gp respectively supplied to the central portion and the peripheral portion of the wafer W, so that the characteristics of the plasma treatment can be variously modified.

As described above, in the first plasma treatment step, Ar gas and $CH_2F_2$ gas are supplied at a predetermined flow rate ratio to each of the gas lines 46 and 47. In the second plasma treatment step, Ar gas, $CH_3F$ gas, $O_2$ gas and CO gas are supplied at a predetermined flow rate ratio to each of the gas lines 46 and 47. The flow rates of the processing gases are controlled by the controller CONT for controlling the gas supply source 100.

Figure 11:
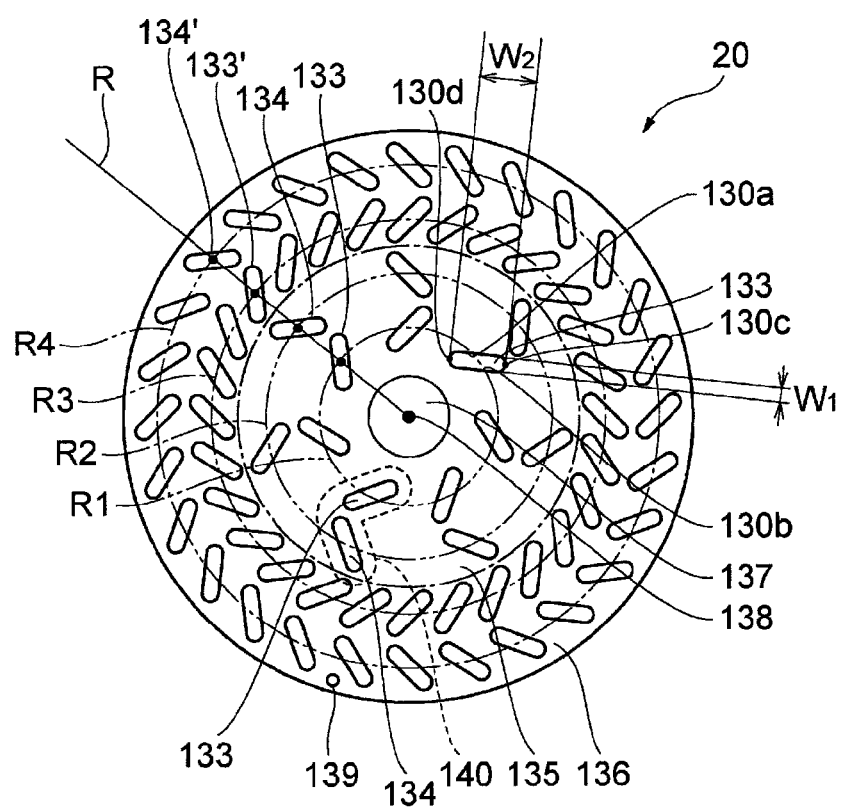
FIG. 11 is a top view of a slit plate.

FIG. 11 shows a top view of the slot plate 20.

The slot plate 20 has a thin circular plate shape. Both surfaces of the slot plate 20 in a thickness direction thereof are flat. The slot plate 20 has two adjacent slots 133 and 134 penetrating therethough in the thickness direction thereof. The slots 133 and 134 form a pair and are arranged in a substantially L-shape that is disconnected at the center. In other words, the slot plate 20 has slot pairs 140, each being formed of a first slot 133 extending in one direction and a second slot 134 extending in a direction perpendicular thereto. An example of the slot pairs 140 is illustrated in a region indicated by a dotted line in FIG. 11.

In the present embodiment, an opening width of the first slot 133, i.e., a length $W_1$ between one wall portion 130$a$ and the other wall portion 130$b$ in the lengthwise direction of the first slot 133, is set to 12 mm. Meanwhile, a length of the first slot 133, i.e., a length $W_2$ between one end portion 130$c$ and the other end portion 130$d$ in the lengthwise direction of the first slot 133, is set to 35 mm. Although the widths $W_1$ and $W_2$ may be changed within a range of ±10%, the device can operate even when the widths are not within such ranges. A ratio $W_1/W_2$ of the short side length to the long side length in the first slot 133 is about $12/35=0.34$, i.e., about ⅓. The opening shape of the first slot 133 is the same as that of the second slot 134. In other words, if the first slot 133 is rotated 90°, the second slot 134 is completely overlapped with the rotated first slot 133. Further, when a long hole such as a slot is formed, the length ratio $W_1/W_2$ is smaller than 1.

The slot pairs 140 is divided into an inner peripheral slot pair group 135 disposed at an inner peripheral side and an outer peripheral slot pair group 136 disposed at an outer peripheral side. The inner peripheral slot pair group 135 has seven slot pairs 140 disposed in an inner region of a virtual circle indicated by a dashed dotted line in FIG. 11. The outer peripheral slot pair group 136 has twenty eight slot pairs 140 disposed in an outer region of the virtual circle indicated by the dashed dotted line in FIG. 11. The seven slot pairs 140 of the inner peripheral slot pair group 135 are spaced apart from each other at a regular interval in the circumferential direction.

With the above configuration, each of the seven slot pairs 140 of the inner peripheral slot pair group 135 can be arranged at a position corresponding to a position of the second recesses that are circular dimples. The twenty eight slot pairs 140 of the outer peripheral slot pair group 136 are spaced apart from each other at a regular interval in the circumferential direction. A through hole 137 is formed at the center of the slot plate 20 in a diametrical direction thereof.

A reference hole 139 is formed through the slot plate 20 in the thickness direction thereof at an outer region of the outer peripheral slot pair group 136. The reference hole 139 allows the slot plate 20 to be easily positioned in the circumferential direction thereof. In other words, the position of the slot plate 20 in the circumferential direction with respect to the processing chamber 2 or the dielectric window 16 is determined while using the reference hole 139 as a mark. The slot plate 20 has rotation symmetry about a center 138 in the diametrical direction except for the reference hole 139.

Each slot pair of the outer peripheral slot pair group 136 is formed of slots 133' and 134'. The positions and the structures of the slots 133' and 134' are the same as those of the slots 133 and 134 except that the slots 133' and 134' are positioned at the outer peripheral region.

The following is detailed description of the structure of the slot plate 20. The slot plate 20 includes: a first slot group 133 separated from the center 138 of the slot plate 20 by a first distance R1 (indicated by a circle R1); a second slot group 134 separated from the center 138 of the slot plate 20 by a second distance R2 (indicated by a circle R2; a third slot group 133' separated from the center 138 of the slot plate 20 by a third distance R3 (indicated by a circle R3); and a fourth slot group 134' separated from the center 138 of the slot plate 20 by a fourth distance R4 (indicated by a circle R4).

Here, the first to the fourth distances R1 to R4 have a relationship of R1<R2<R3<R4. An angle between a straight line (line segment R) extending from the center position 138 of the slot plate toward a target slot (one of the slots 133, 134, 133' and 134') and a lengthwise direction of the corresponding slot is the same in each of the first to the fourth slot groups 133, 134, 133' and 134'.

The slot 133 of the first slot group and the slot 134 of the second slot group which are positioned on the same straight line (the line segment R) extending from the center position 138 of the slot plate 20 are elongated in different directions (orthogonally in this example). A slot 133 of the third slot group and a slot 134 of the fourth slot group which are positioned on the same straight line (the line segment R) extending from the center position 138 of the slot plate 20 are elongated in different directions (orthogonally in this example). The number of the slots 133 of the first slot group and the number of the slots 134 of the second slot group are the same (N1), and the number of the slots 133' of the third slot group and the number of the slots 134' of the fourth slot group are the same (N2).

Here, N2 is an integer multiple of N1. With this configuration, a plasma having high in-plane symmetry can be generated.

Figure 12:
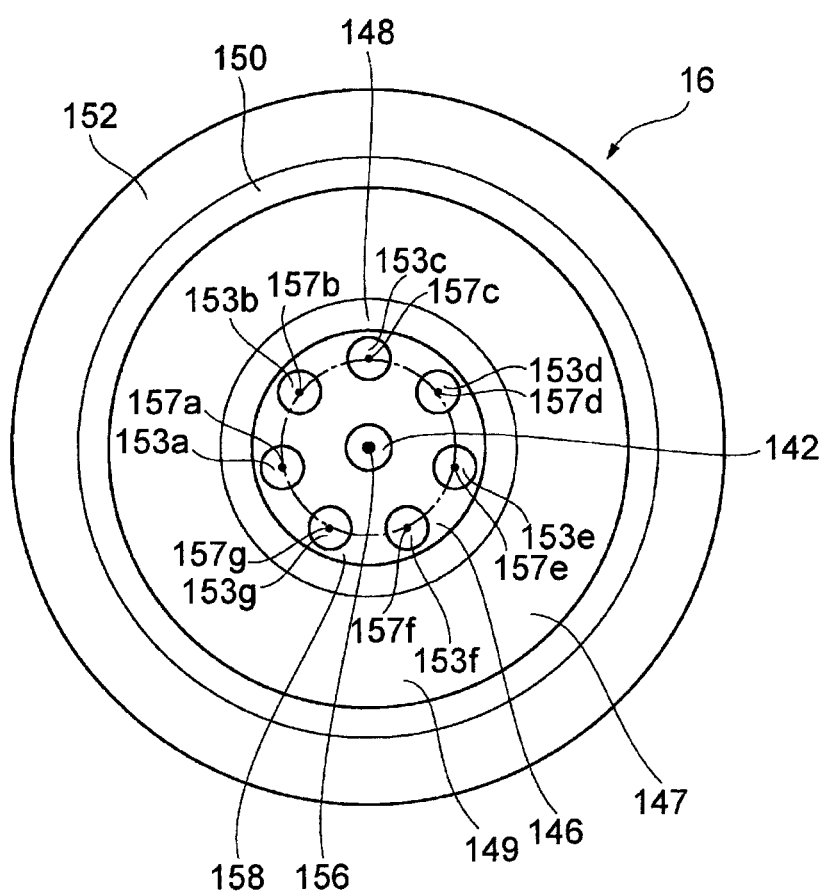
FIG. 12 is a top view of a dielectric window.
Figure 13:
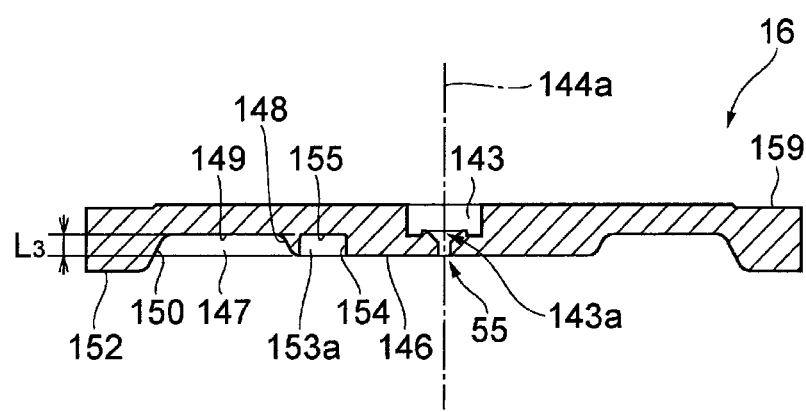
FIG. 13 is a cross sectional view of the dielectric window.

FIG. 12 is a top view of the dielectric window 16. FIG. 13 is a vertical cross sectional view of the dielectric window 16.

The dielectric window 16 has a substantially circular plate shape and has a predetermined plate thickness. The dielectric window 16 is made of a dielectric material. Specifically, the dielectric window 16 is made of quartz, alumina or the like. The slot plate 20 is coaxially disposed on a top surface 159 of the dielectric window 16.

A through hole 142 penetrating through the dielectric window 16 in a thickness direction thereof, i.e., in a direction perpendicular to the paper surface of FIG. 12, is formed at the center of the dielectric window 16 in a diametrical direction thereof. A lower region of the through hole 142 serves as a gas supply hole of the central inlet unit 55, and an upper region of the through hole 142 serves as a recess 143 where the block 57 of the central inlet unit 55 is accommodated. Further, a central axis 144$a$ of the dielectric window 16 in the diametrical direction is indicated by a dashed dotted line in FIG. 13.

A first recess 147 that extends in a ring shape and is tapered inwardly in the thickness direction of the dielectric window 16 is provided outside a flat surface 146 in the diametrical direction. The flat surface 146 is disposed at the bottom surface of the dielectric window 16 where the plasma is generated when the dielectric window 16 is installed at the plasma processing device. The flat surface 146 is provided at a central region of the dielectric window 16 in the diametrical direction. Circular second recesses 153a to 153g spaced apart from each other at a regular interval in the circumferential direction are formed at the central flat surface 146. The ring-shaped first recess 147 includes: an inner tapered surface 148 tapered outward from a peripheral region of the flat surface 146, i.e., inclined with respect to the flat surface 146; a flat bottom surface 149 straightly extending outward from the inner tapered surface 148, i.e., in parallel to the flat surface 146; an outer tapered surface 150 extending outward from the bottom surface 149, i.e., inclined with respect to the bottom surface 149.

Angles of the tapered surfaces, e.g., an angle defined in a direction in which the inner tapered surface extends with respect to the bottom surface 149 and an angle defined in a direction in which the outer tapered surface 150 extends with respect to the bottom surface 149, are arbitrarily set. In the present embodiment, the angles are the same at any positions in the circumferential direction. The inner tapered surface 148, the bottom surface 149 and the outer tapered surface 150 extend as smooth curved surfaces.

Provided at an outer side of the outer tapered surface 150 is an outer peripheral flat surface 152 extending straightly outward in the diametrical direction, i.e., in parallel to the flat surface 146. The outer peripheral flat surface 152 serves as a supporting surface for the dielectric window 16. The outer peripheral flat surface 152 of the dielectric window 16 is formed at an upper end surface of a cylindrical member constituting the processing chamber 102.

Due to the presence of the ring-shaped first recess 147, a region where the thickness of the dielectric window 16 varies continuously is formed at the outer region of the dielectric window 16 in the diametrical direction. This results in formation of a resonance region in which the dielectric window 16 has a thickness suitable for various processing conditions for plasma generation. Accordingly, under various processing conditions, high stability of the plasma can be obtained at the outer region in the diametrical direction.

In the dielectric window 16, the second recesses 153 (153a to 153g) that are recessed inwardly from the flat surface 146 in the plate thickness direction are formed at the inner region of the ring-shaped first recess 147 in the diametrical direction. The second recesses 153 have a circular shape in a plan view. The second recesses 153 have cylindrical inner surfaces and flat bottom surfaces. Since a circle is a polygonal with infinite corners, the second recesses 153 may have a polygonal shape with finite corners in a plan view. It is considered that the plasma is generated in the recess during introduction of microwaves. When the recess has a circular shape, the shape from the center has a high uniformity, so that the plasma can be stably generated.

In the present embodiment, the total number of the second recesses 153 is seven, and this is the same as the number of the inner slot pairs. The seven recesses 153a to 153g have the same shape. In other words, the second recesses 153a to 153g have the same shape, the same depth, the same hole diameter, and the like. The seven second recesses 153a to 153g are spaced apart from each other at a regular interval so as to have rotation symmetry about the center 156 of the dielectric window 16 in the diametrical direction. When viewed from the thickness direction of the dielectric window 16, centers 157a to 157g of the circular hole-shaped seven second recesses 153a to 153g are positioned on a circle 158 having the center 156 of the dielectric window 16 as the center. In other words, even if the dielectric window 16 is rotated by 51.42° (=360°/7) about the center 156 of the dielectric window 16, the same shape as that before the rotation is obtained. The circle 158 is indicated by a dashed-dotted line in FIG. 12. The diameter of the circle 158 is 154 mm, and the diameter of the second recesses 153a to 153g is 30 mm.

The depth of the second recesses 153 (153a to 153g), i.e., a distance between the flat surface 146 and the bottom surface 155 which is expressed by a length $L_3$ in FIG. 13, is properly set. In the present embodiment, it is set to 32 mm. The diameter of the second recesses 153 and the distance from the bottom surface of the recesses 153 to the top surface of the dielectric window are set to be ¼ of a wavelength λg of the microwave introduced thereinto. In the present embodiment, the diameter of the dielectric window 16 is about 460 mm. The diameter of the circle 158, the diameter of the recesses 153, the diameter of the dielectric window 16 and the depth of the recesses 153 may vary within a range of ±10% of the above values. However, conditions for operating the present device are not limited thereto, and the device can operate as long as the plasma is confined in the recesses. If the diameter or the depth of the recesses close to the center is increased, the plasma density becomes higher at the central side than at the peripheral side. Therefore, balance in the plasma density between the central side and the peripheral side can be adjusted by adjusting the diameter or the depth of the recesses.

Due to the presence of the second recesses 153a to 153g, an electric field of the microwave can concentrate in the recesses, and a mode can be firmly locked in the inner region of the dielectric window 16 in the diametrical direction. In that case, since the region where the mode is firmly locked can be obtained in the inner region of the dielectric window 16 in the diametrical direction regardless of changes in various processing conditions, the plasma can be stably and uniformly generated and, thus, the substrate can be uniformly processed over the surface. Especially, the second recesses 153a to 153g have rotation symmetry, so that the region where the mode is firmly locked can have high axial symmetry in the inner region of the dielectric window 16 in the diametrical direction, and the generated plasma has high axial symmetry.

The dielectric window 16 configured as described above has a wide range of process margin, and the generated plasma has high axial symmetry.

The antenna of the present embodiment is formed by coaxially overlapping the slot plate 20 and the dielectric window 16. When seen from the Z-axis direction, the outer tapered surface 150 is partially overlapped with the slots 134' of the fourth slot group (the fourth slot group from the center). Further, the ring-shaped flat bottom surface 149 is overlapped with the slots 133' of the third slot group (the third slot group from the center).

In the same manner, the inner tapered surface is overlapped with the slots 134 of the second slot group (the second slot group from the center) when seen from the Z-axis direction. Further, the slots 133 of the first slot group in the innermost position are arranged on the flat surface 146. The center positions of the second recesses 153 are respectively overlapped with the corresponding slots 133.

In this example, the center positions of the slots 133 coincide with those of the second recesses 153, and the center positions of the second recesses 153 are positioned within the slots 133. In that case, the plasma is firmly confined in the second recesses 153, so that there are little fluctuation in the plasma state and little in-plane variation of the plasma state in spite of changes in various conditions. Especially, since the recesses 153 are formed on the central flat surface 146, the shape of the surface surrounding the recess 153 is uniform and the degree of plasma confinement is increased.

As described above, the plasma processing method for coating the insulating film FL on the surface of the substrate including the part having a convex cross-sectional shape which erected on the substrate main body and performing plasma treatment on the insulating film FL includes: a first plasma treatment step of forming the protective film 6 on the surface of the insulating film FL by performing first plasma treatment on the surface of the substrate (see FIG. 6); and a second plasma treatment step of removing the insulating film formed at the top portion of the part having a convex cross-sectional shape and peripheral portions thereof without removing the insulating film FL formed at both side surfaces of the part having a convex cross-sectional shape by performing second plasma treatment on the surface of the substrate (see FIG. 7).

The first and the second plasma treatment step are carried out by the plasma treatment device including the antenna having the dielectric window 16 containing $SiO_2$ and the slot plate 20 provided at one surface of the dielectric window 16. This plasma treatment device 20 converts the processing gas supplied to the vicinity of the dielectric window 16 into a plasma while supplying the microwave to the antenna and supplies the plasma of the processing gas to the surface of the substrate.

The insulating film FL is made of silicon carbonitride. The processing gas in the first plasma treatment step contains no oxygen gas and contains a specific fluorocarbon-based gas. The processing gas in the second plasma treatment step contains oxygen gas and a specific fluorocarbon-based gas.

In accordance with the plasma treatment method and the plasma treatment device, the protective film can be effectively formed in the first plasma treatment and it is possible to remove the insulating film formed at the top portion of the part having a convex cross-sectional shape and peripheral portions thereof without removing the insulating film that coats the side surfaces of the part having a convex cross-sectional shape. Further, the above-described values may have a tolerance within a range of +10%.

DESCRIPTION OF REFERENCE NUMERALS

1: substrate
2: lower insulating layer
3: semiconductor channel layer
4: upper insulating layer
GD: gate insulating film
G: gate electrode
W: wafer (substrate)
102: processing chamber
103: stage
11a: gas exhaust port
16: dielectric window
20: slot plate
21(133,134): slot
35: microwave generator
46,47: gas line
55: central inlet unit
58: central inlet port
61: peripheral inlet unit
62: peripheral inlet port

What is claimed is:

1. A plasma treatment method for coating an insulating film on a surface of a substrate including a part having a convex cross-sectional shape which is erected on a substrate main body and performing plasma treatment on the insulating film, the method comprising:
   a first plasma treatment step of forming a protective film on a surface of the insulating film by performing first plasma treatment on the surface of the substrate; and
   a second plasma treatment step of removing the insulating film formed at a top portion of the part having a convex cross-sectional shape and peripheral portions thereof without removing the insulating film formed at both side surfaces of the part having a convex cross-sectional shape by performing second plasma treatment on the surface of the substrate,
   wherein the first plasma treatment step and the second plasma treatment step are performed by a plasma treatment device including a processing chamber in which the substrate is provided, a dielectric window containing $SiO_2$, and an antenna having a slot plate installed at one surface of the dielectric window, the plasma treatment device configured to convert a processing gas by supplying a processing gas to the vicinity of the dielectric window while supplying the microwave to the antenna and supply the plasma of the processing gas toward the surface of the substrate;
   wherein the insulating film is made of a silicon carbonitride;
   wherein the processing gas supplied into the processing chamber in the first plasma treatment step contains no oxygen gas and contains a fluorocarbon-based gas containing C and F; and
   the processing gas supplied into the processing chamber in the second plasma treatment step contains oxygen gas and the fluorocarbon-based gas containing C and F.

2. A plasma treatment method of claim 1, wherein the fluorocarbon-based gas supplied into the processing chamber in the first plasma treatment step is at least one selected from a group consisting of $CH_2F_2$, $CH_3F$, $CHF_3$, $CF_4$, $C_5F$ and $C_4F_8$, and the fluorocarbon-based gas supplied into the processing chamber in the second plasma treatment step is at least one selected from a group consisting of $CH_3F$, $CF_4$, $CHF_3$, $CH_2F_2$, $C_5F$ and $C_4F_8$.

3. A plasma treatment method of claim 1, wherein in the first plasma treatment step, a first bias voltage is applied to the substrate;
   in the second plasma treatment step, a second bias voltage is applied to the substrate; and
   the first bias voltage is higher than the second bias voltage.

* * * * *